United States Patent [19]

Reed

[11] 4,002,995
[45] Jan. 11, 1977

[54] DIGITAL FREQUENCY SYNTHESIZER HAVING SELECTABLE FREQUENCY OFFSET BETWEEN TRANSMIT AND RECEIVE FREQUENCIES

[75] Inventor: L. J. Reed, Mesa, Ariz.
[73] Assignee: Motorola Inc., Chicago, Ill.
[22] Filed: July 7, 1975
[21] Appl. No.: 593,893
[52] U.S. Cl. .................................. 331/1 A; 331/25
[51] Int. Cl.² ........................................ H03B 3/04
[58] Field of Search ............. 331/1 A, 18, 25; 325/20

[56] References Cited
UNITED STATES PATENTS 2,846,572  8/1958  Elliott ............................ 325/20 X
3,944,925  3/1976  De Laune ..................... 331/1 A X

*Primary Examiner*—Siegfried H. Grimm
*Attorney, Agent, or Firm*—Eugene A. Parsons

[57] ABSTRACT

A digital frequency synthesizer includes a phase locked loop having dual presetting means for enabling the loop to generate a first frequency signal (e.g., "transmit" signal) for each of many selectable channels and generate a second frequency signal (e.g., "receiver" signal) in the form of the first frequency signal set off by an intermediate frequency (e.g., IF frequency) and programmable means for varying the frequency offset.

4 Claims, 5 Drawing Figures

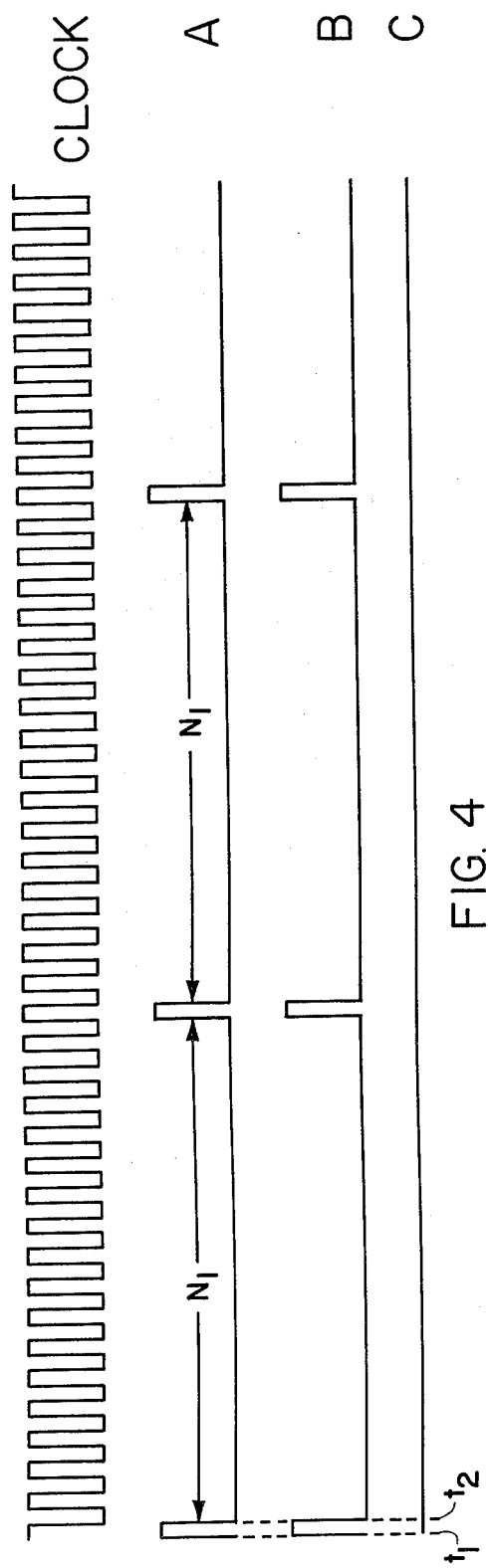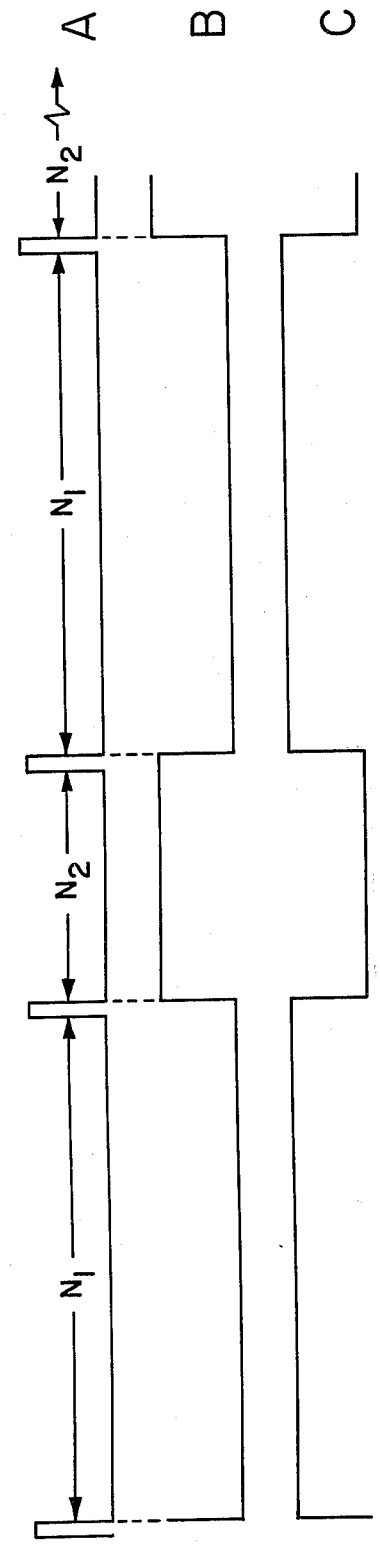

DIGITAL FREQUENCY SYNTHESIZER HAVING SELECTABLE FREQUENCY OFFSET BETWEEN TRANSMIT AND RECEIVE FREQUENCIES

BACKGROUND OF THE INVENTION

1. Field of the Invention

This invention relates to an improved frequency synthesizer and more particularly to an improved digital frequency synthesizer.

2. Prior Art

The frequency generating section of a transceiver typically includes a frequency synthesizer having a phase locked loop adapted to generate one frequency for each of many channels selectable by a front panel control when a "transmit" mode is selected and another frequency set off by the intermediate frequency (IF) when a "receive mode" is selected. Digitally programmed frequency synthesizer is often used for this purpose as a local oscillator in the channelized transceiver. With the present state of technology and available parts, the implementation of a synthesizer to generate a band of channelized frequencies is relatively straight forward and typically the voltage controlled oscillator (VCO) and loop filter are left as the design variables in the implementation. The synthesizer allows the channel selection by the use of a front panel control where switches or some other suitable means, such as thumb wheel switches, are provided to control the selection of the transmit frequency.

Several approaches exist for obtaining the frequency offset required during the receive mode according to the current state of the art: They are, mixing, direct logic implementation and adders. The mixing approach is used extensively because of its relatively low cost and simplicity. However, the mixing technique has the disadvantage of requiring an additional oscillator for the IF frequency. Moreover, except for the applications requiring a narrow tuning range, a tank circuit required for the mixer must be designed to track the synthesizer oscillator. Also it has been found that the mixing technique tends to generate spurious noise frequencies which can severely degrade the synthesizer system performance.

For certain applications where tuning range is wide and the IF frequency is simple (e.g., 10 MHz, 20 MHz, etc), the direct logic implementation approach is used to the programming inputs to add, on command, the IF frequency to the transmit frequency to provide the receive frequency. This technique is used in some aircraft radios built today. However, it becomes prohibitively expensive, because of the logic complexity, large number of circuit packages and the high power required for the standard IF frequencies, such as, 10.7 MHz, 21.4 MHz, etc. and for frequency bands where the IF offset cannot be accomplished by adding or subtracting a number to the most significant divider in the divider chain.

The adders offer a universal solution for frequency offsetting for any IF frequency but are used in very few applications because of the large number of complex logic circuit packages required, large power dissipation, high price and difficulty of obtaining natural binary coded decimal adders (NBCD).

SUMMARY OF THE INVENTION

It is an object of the present invention to overcome the aforementioned shortcomings and disadvantages of digital frequency synthesizer.

It is another object of the present invention to provide an improved digital frequency synthesizer adapted to provide wide range of frequency and programmable means for making it possible to set the IF offset frequency to any desired value.

The aforementioned and other shortcomings of the prior art are overcome and the aforementioned and other objects of the present invention are accomplished in accordance with the present invention, by a dual presetting approach which allows the selection of the channelized transmit and receive frequencies and which permits change in the IF offset frequency to any number in a straight forward manner using an offset control and an offset programmer. The dual presetting system produces the required shift in frequency by adding the IF frequency to the transmit frequency by alternately programming the divide counters in the phase locked loop of the synthesizer to the transmit frequency and the IF frequency.

The complexity of the present inventive synthesizer depends on the IF frequency required; but it is always less complex than the adder approach and is comparable to the direct logic implementation approach. Advantageously, the present synthesizer is readily applicable in the low frequency as well as high frequency region and does not require high performance, high powered circuits to accomplish this function. It does not require an additional oscillator and tank circuits as required by the mixing method. The present dual presetting approach requires use of an offset control and an offset programmer combination for providing the frequency offsetting function.

BRIEF DESCRIPTION OF THE DRAWINGS

FIGS. 4 and 5 show timing waveforms helpful in describing the operation of the frequency synthesizer.

DETAILED DESCRIPTION

Figure 1:
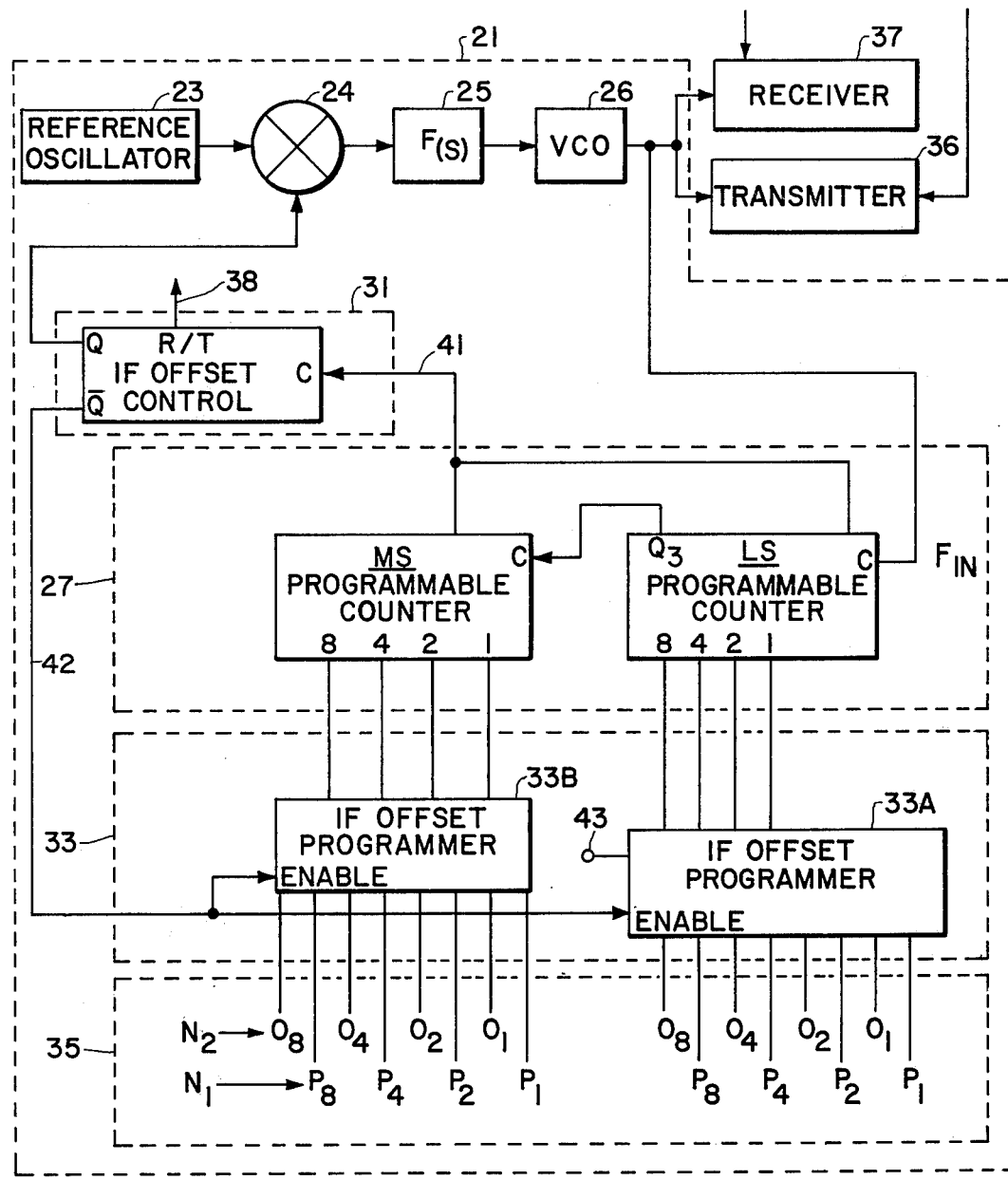
FIG. 1 shows a functional schematic block diagram of the frequency synthesizer used in a transceiver.

Referring to FIG. 1, there is shown an illustrative embodiment of a digital frequency synthesizer 21 of the present invention used in a transceiver capable of providing a transmit frequency for each of the many channels that may be selected by a front panel control and a receive frequency set off by the intermediate frequency (IF) when the receive mode is selected. As an aside, it is noted here that phrases transmit and receive frequency are used to describe the present invention. However, it is to be clearly understood that the expressions transmit and receive frequency are used for convenience for the benefit of quicker appreciation of the principles of the present invention in the language of transceiver art familiar to most readers. It is clear, however, that the expressions are used merely to designate one frequency as opposed to another that is offset from said one frequency. The two frequencies may be used for transmission or reception purposes as they would be, if they were used in a transceiver, or may be merely outputs in two frequencies which may be used for some other purpose. For these reasons, it is to be clearly understood that the words transmit or receive are not to be construed to limit the scope of the invention.

The digital frequency synthesizer 21 includes a crystal oscillator 23, phase detector 24, filter 25 and VCO 26, connected in the forward path and configured to operate in a conventional manner. As illustrated, in the feedback path of the phase locked loop, there are provided frequency dividing means in the form of a counting means 27, offset control 31 and offset programmer 33 operatively connected to provide the channel selection for the transmit frequency under the control of a front panel control 35. The control 35 may be in the form of a thumb wheel switch. The synthesizer 21 may be used in a transceiver (FIG. 1) having a transmitter 36 of any suitable design for operating the transceiver in a transmit mode for sending out a signal and a receiver 37 for receiving an incoming signal when the transceiver is operated in a receive mode.

Figure 2:
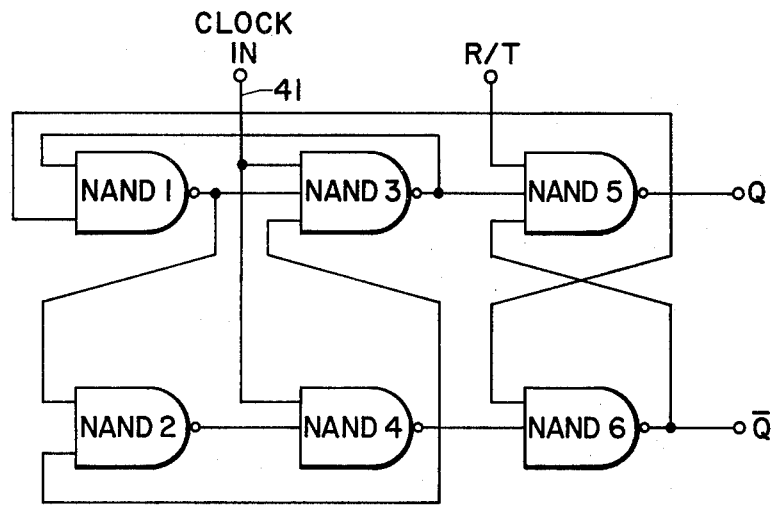
FIG. 2 shows a logic block diagram of the offset control circuitry of the synthesizer.

Referring to the offset control circuitry 31, there is shown an illustrative example in the form of a logic circuitry in FIG. 2. As illustrated, the offset control circuitry includes a plurality of logic gates, for example, NAND gates 1–6, configured to provide two outputs Q and $\overline{Q}$ in response to two inputs as follows. One of the two inputs deals with the mode selection control signal which may be a transmit or a receive mode selection signal from a push button 38 (FIG. 1) in a conventional manner. The mode selection signal is applied to the input R/T terminal and may appear in the form of logical "1" or "0". The other input is a train of pulses coming from the counting means 27 and is applied to the terminal 41. So the mode selection operation of the offset control is under the control of the R/T input. With the R/T input at a logical "1", which may signify that the synthesizer is to function in the receive mode, the control logic circuitry divides the incoming pulse train applied to the input 41 of the IF offset control by two and provides the two outputs at the two output terminals Q and $\overline{Q}$.

With the R/T input set at a logical "0", which may signify that the synthesizer is to operate in the transmit mode, the whole offset control circuitry functions merely as a buffer gate that follows the input pulse train from the counter means 27 and buffers it and applies it to the output Q. The $\overline{Q}$ output however, is maintained at a logical "1" level and retained in that status. If desired, there may be provided an inverting gate (not shown) between the output of the counter means and the clock input 41 for inverting the polarity of the output of the offset control. This option may be used when needed to insure that the offset control logic circuitry can be clocked on the same edge that clears the counter presets of the counting means.

The counting means 27 may be of any suitable conventional type; for example, it may be made of one or more counters connected in series where the counters may be connected to provide the most significant bit (MS) to the least significant bit (LS) as schematically illustrated in FIG. 1. While only two counters are shown, it is to be understood that additional counters may be connected in series to provide MS, 2nd MS, 3rd MS, and so on, to LS bit counter to provide the dividing function of the counting means 27. For the counters one may use those manufactured and made available by Motorola under the product code name MC4016.

Figure 3:
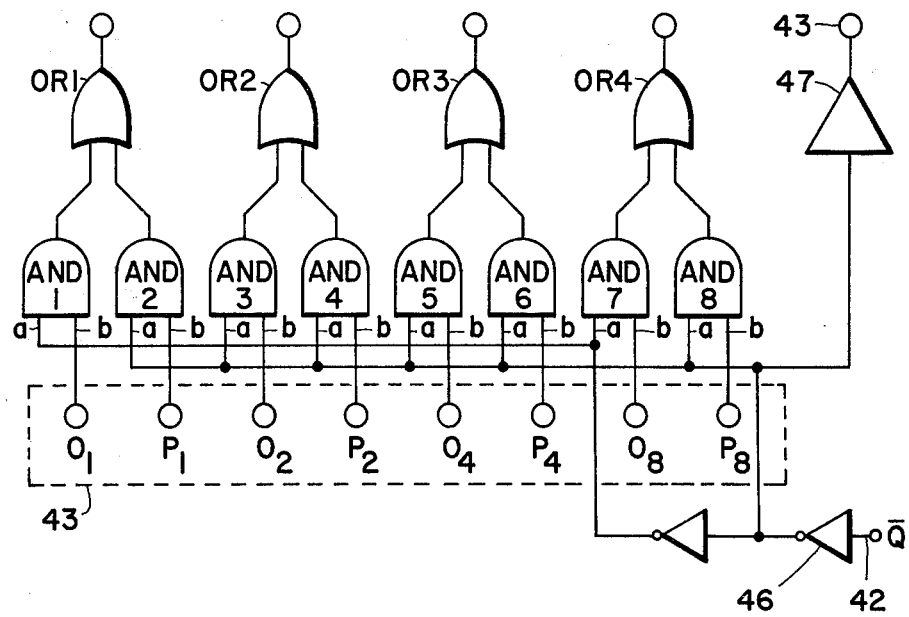
FIG. 3 shows a logic block diagram of offset programmer of the present frequency synthesizer.

For the IF offset programmer, there is shown an illustrative embodiment of a logic circuitry in FIG. 3. Advantageously, the offset programmer may be in the form of logic circuitry adapted to function as an eight input-four output data selector constructed from low level transistor logic (TTL) gates, such as those made available by Motorola under the product code name, MC12021. As schematically illustrated, the logic gates may be configured to implement a four pole-two position switching function with the switch position under the control of an input 42 coming from the $\overline{Q}$ output of the offset control circuitry 31. As an optional feature, a buffer output 43 that follows the enable input 42 via inverting gates 46 and 47 is provided and may be used for programming the counters MS, 2nd MS, . . . , LS.

The digital output bits of the offset programmer 33 are applied to the programming input leads of the counters. The transmit frequency number is in the form of binary or binary coded decimal numbers and can be programmed into the counter programming inputs (8,4,2,1). This is done by the operator controlling the input transmit frequency by turning the usual thumb wheel switches at the control panel 35 or other suitable control means such as dials as shown in FIGS. 1 and 3. As shown in FIG. 3, the IF offset frequency numbers are programmed into the O inputs ($O_1$, $O_2$, $O_4$ and $O_8$) of the offset programmer. Setting of the IF frequency is very expediously and readily accomplished by connecting the "0" inputs (i.e., $O_1$, $O_2$, $O_4$, $O_8$) to either ground, i.e., logic 0, or to power supply, i.e., logic "1" selectively to form a natural number NBCD. For example, suppose one wants to divide by 8, this is accomplished by connecting 0 inputs $O_1$, $O_2$, $O_4$, $O_8$ for 0001.

The operation of the dual presetting synthesizer of the present invention will now be described in conjunction with FIGS. 1–3 and the timing waveform shown in FIGS. 4 and 5. Suppose a transmit frequency is represented by a number $N_1$ and a receive frequency by another number $N_2$ which represents an offset number added to $N_1$ and suppose further that, by way of an example, the transmit and receive frequencies, can be represented by 17(0001 0111) and 8(0000 1000), respectively. As illustrated, in FIGS. 3–5, this can be set up readily by setting P terminals ($P_8$, $P_4$, $P_2$, $P_1$) of the two programmers 33A and 33B to form NBCD code 0001, 0111 and the 0 terminals ($O_8$, $O_4$, $O_2$, $O_1$) of the two programmers to form NBCD code 0000 1000, respectively. As the synthesizer stabilizes the counters are at zero state. Now suppose that the R/T input is at a logical "1" signifying the selection of the transmit mode. In response, the $\overline{Q}$ out is a logical "1." This enables the programmmers to apply the number set at O and P terminals to the counters as follows: At time $t_1$ (FIG. 4), the counters are at zero (0) and this is signified by logical "1" at the output of the counting means (see FIG. 4A at $t_1$). As the counter output goes to 1, the counters preset to the number programmed, in this case, $N_1$. The counter output stays high until time, $t_2$, i.e., falling or lagging edge of the same clock input pulse. The falling edge clears the reset to the counters. The counters then decrement to zero from the number set (e.g., 0001, 0111) on command of the clock pulses. In this manner the clock pulses are counted. When the counters go to zero, their output goes high at terminal 41 and again enables the programmers to preset the counters to the number $N_1$. The same is repeated to provide transmit count to the PLL phase detector 24. Thus, in transmit mode, $Q_1$ output (FIG. 4B) of the IF offset control applies the input to the IF offset control as is to the phase detector 24.

The synthesizer operates in the receive mode as follows: IF offset control circuit 31 enables the programmers to preset the counters to two numbers, i.e., $N_1$ and $N_2$, alternately (FIG. 5A). The counters divide the input from VCO 26 with the two numbers $N_1$ and $N_2$ alternately and the output of the counters is applied to the IF offset control. In turn, IF offset provides an output as shown in FIG. 5B which provides one pulse for every two pulses applied to the input thereof representing $N_1$ and $N_2$. Thus, in short, IF control output applied to phase detector 24 is equal to the clock input divided by $N_1 + N_2$.

As apparent from above during the receive mode the output of the IF control varies between logical "1" and "0" in response to the change in the voltage level of the output of the counter applied at the input terminal of the IF control 41. This is the case since logical "1" is applied to the input lead R/T in the receive mode and the IF control logic circuit is so configured as shown in FIG. 2 to follow the input.

The operation of the frequency synthesizer described above is valid for any number of IF offset programmers and counters. The number of the IF offset programmers required by any synthesizer system is a function of the required IF frequency.

In summary, there has been described an inventive frequency synthesizer with a phase locked loop having an offset control and offset programming means for enabling the synthesizer to generate selected frequency outputs in the transmit mode and offsetting the output by an IF frequency and means for setting or programming the magnitude of the IF frequency very simply and conveniently. The dual presetting approach described hereinabove offers an efficient and economical solution to the problem of IF offsetting in that utilization of the IF offset control and offset programming means makes the implementation straightforward. Various changes and modifications will be apparent to one of the ordinary skill without departing from the spirit and scope of the present invention.

What is claimed is:

1. In a frequency synthesizer of the type including a phase locked loop for providing a first frequency output or a second frequency output the frequency of which is set off from that of the first frequency output by an intermediate frequency, the improvement which comprises:
   presetting means for enabling said synthesizer to selectively generate one of the first and the second frequency outputs; and
   programmable means coupled to said presetting means for programmably setting the value of said intermediate frequency to any desired frequency within the capabilities of the frequency synthesizer.

2. The synthesizer according to claim 1 wherein the synthesizer includes a forward path having a phase detector and a voltage controlled oscillator for providing an output frequency, F, and a feedback path having therein said presetting means, wherein said presetting means comprises counter means for dividing the output frequency, F, of the oscillator.

3. The synthesizer according to claim 2 wherein the programmable means includes:
   means for setting said programmable means to a first number, $N_1$, and a second number, $N_2$;
   control means responsive to a first mode control signal to enable said programmable means to preset said counter means to the first number, $N_1$, so that said counter means divides the output frequency, F, of the phase locked loop by $N_1$ to provide an output frequency of $F/N_1$ and applies the output frequency, $F/N_1$, to the phase detector, and
   said control means being responsive to a second mode control signal to enable said programmable means to preset said counter means to the first number, $N_1$, and the second number, $N_2$, alternately, so that said counter means provides an output of $F/N_1$, frequency and $F/N_2$ frequency, alternately, and applies a signal of $F/N_1+N_2$ to said phase detector.

4. A frequency synthesizer comprising:
   a forward path having a reference oscillator, a phase detector, a low pass filter and a voltage controlled oscillator connected in series;
   a feedback path coupled between said phase detector and an output of said voltage controlled oscillator, said feedback path including a programmable counter having a plurality of programming inputs and control means for setting the synthesizer to operate in a first mode and a second mode selectively;
   programming means having predetermined programming capabilities and coupled to the programming inputs of said programmable counter for programming substantially any desired first number, $N_1$, and substantially any desired second number, $N_2$, within the predetermined capabilities of said programming means; and
   means for enabling said programming means to set said programmable counter to said first number, $N_1$, for enabling said synthesizer to generate a first frequency output equal to the output frequency of the forward path divided by $N_1$ for the first mode of operation and to set said programmable counter alternately to the first number, $N_1$, and the second number, $N_2$, for enabling said synthesizer to generate a second frequency output signal the frequency of which is equal to the output frequency of the forward path divided by $N_1$ plus $N_2$ for the second mode of operation.

* * * * *